(12) United States Patent
Prall et al.

(10) Patent No.: US 6,337,244 B1
(45) Date of Patent: *Jan. 8, 2002

(54) METHOD OF FORMING FLASH MEMORY

(75) Inventors: Kirk D. Prall; Guy T. Blalock, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/516,818

(22) Filed: Mar. 1, 2000

(51) Int. Cl.$^7$ ............... H01L 21/336; H01L 21/8242; H01L 21/302; H01L 21/461; B44C 1/22

(52) U.S. Cl. ............... 438/257; 438/241; 438/710; 216/79

(58) Field of Search ................ 438/258, 259, 438/241, 706, 710, 714, 201; 216/72, 79

(56) References Cited

U.S. PATENT DOCUMENTS

| | | | |
|---|---|---|---|
| 5,153,143 A | 10/1992 | Schlais et al. | 437/43 |
| 5,376,572 A | 12/1994 | Yang et al. | |
| 5,424,233 A | 6/1995 | Yang et al. | |
| 5,498,558 A | 3/1996 | Kapoor | |
| 5,605,853 A | 2/1997 | Yoo et al. | 437/43 |
| 5,691,246 A | * 11/1997 | Becker et al. | 437/225 |
| 5,976,927 A | * 11/1999 | Hsieh et al. | 438/239 |
| 6,020,229 A | 2/2000 | Yamane et al. | 438/201 |
| 6,043,123 A | 3/2000 | Wang et al. | 438/258 |
| 6,074,915 A | 6/2000 | Chen et al. | 438/258 |
| 6,074,959 A | * 6/2000 | Wang et al. | 438/738 |
| 6,096,603 A | 8/2000 | Chang et al. | 438/258 |
| 6,149,828 A | * 11/2000 | Vaarstra | 216/57 |
| 6,197,639 B1 | 3/2001 | Lee et al. | 438/258 |

* cited by examiner

Primary Examiner—Richard Elms
Assistant Examiner—Adam Pyonin
(74) Attorney, Agent, or Firm—Wells, St. John, Roberts, Gregory & Matkin, P.S.

(57) ABSTRACT

A method of forming a line of FLASH memory cells includes forming a first line of floating gates over a crystalline silicon semiconductor substrate. An alternating series of $SiO_2$ isolation regions and active areas are provided in the semiconductor substrate in a second line adjacent and along at least a portion of the first line of floating gates. The series of active areas define discrete transistor source areas. A masking layer is formed over the floating gates, the regions and the areas. A third line mask opening is formed in the masking layer over at least a portion of the second line. Anisotropic etching is conducted of the $SiO_2$ isolation regions exposed through the third line mask opening substantially selectively relative to crystalline silicon exposed through the third line mask opening using a gas chemistry comprising a combination of at least one non-hydrogen containing fluorocarbon having at least three carbon atoms and at least one hydrogen containing fluorocarbon. The isolation regions are preferably formed in trenches previously etched into the crystalline silicon comprising semiconductor substrate. The anisotropic etching preferably removes substantially all of the third line opening exposed isolation regions. Further, conductivity enhancing impurity is preferably implanted through the third line opening into the crystalline silicon semiconductor substrate beneath the trenches, along sidewalls of the trenches and between the trenches and forming therefrom a continuous line of source active area.

72 Claims, 7 Drawing Sheets

_Fig 4_

_Fig 5_

_Fig 12_

_Fig 13_

METHOD OF FORMING FLASH MEMORY

TECHNICAL FIELD

This invention relates generally to FLASH memory and methods of forming FLASH memory.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line (hereafter referred to as "a line of floating gates"). Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array. Accordingly, prior art techniques have been utilized to form a line of continuously running implanted source material within the semiconductor substrate and running parallel with the floating gate word lines.

In a principal technique of achieving the same, the substrate has first been fabricated to form field oxide regions by LOCOS. The fabrication forms alternating strips of active area and LOCOS field oxide running substantially perpendicular to the floating gate word lines which will be subsequently formed. Thus running immediately adjacent and parallel with the respective word lines will be an alternating series of LOCOS isolation regions and active area regions on both the source and drain sides of a respective line of floating gates. After forming the lines of floating gates and to provide a continuous line of essentially interconnected source regions, the substrate is masked to form an exposed area on the source side of the respective lines of floating gates. The LOCOS oxide is then selectively etched relative to the underlying substrate. This leaves a series of spaced trenches along the lines of floating gates the result of removal of oxide from the previously oxidized substrate which formed the LOCOS regions.

Non-recessed LOCOS in fabrication of FLASH memory in this manner is typically very shallow relative to the semiconductor substrate (i.e., less than 1500 Angstroms deep). This leaves a gradual, almost sinusoidal, undulating surface of exposed semiconductor substrate running in lines substantially parallel and immediately adjacent the lines of floating gates on the desired source side. With the gently sloping sidewalls of the trenches or recesses left by the LOCOS oxide removal, one or more source ion implant steps are conducted through the mask openings of the remaining photoresist layer. The result is formation of a continuously and conductively doped source line within the semiconductor substrate immediately adjacent the line of floating gates.

Circuitry fabrication and isolation of adjacent circuitry within a semiconductor substrate can also be achieved with a trench isolation that is different from LOCOS. For example, trenches can initially be etched within a semiconductor substrate and subsequently filled with an insulating material, such as high density plasma deposited oxide. Such trenches can and are sometimes made considerably deeper relative to the outer substrate surface as compared to the oxidation depth of LOCOS. Accordingly, the etching typically produces elongated, deeper and straighter sidewalls than LOCOS. Regardless of whether using LOCOS or trench isolation, the etching away of the isolation regions (typically undoped silicon dioxide) to ultimately form continuous source lines typically attacks both the insulated top of the floating gate line stack and the active area source regions thereadjacent. Presently using an etching gas chemistry mixture of $CF_4$, $CHF_3$ and argon, it has been discovered that selectivity to silicon in forming the continuous silicon source area is not as great as desired, with in many instances 600 Angstroms of silicon being etched in the active/non-isolation area.

Such silicon loss has previously been considered to be insignificant. Yet recent consideration has shown that such silicon loss can have a detrimental effect on FLASH cell reliability and erase uniformity. It would be desirable to develop improved FLASH cell memory fabrication processes which reduce such silicon loss.

SUMMARY

The invention includes methods of forming FLASH memory. In one implementation, a method of forming a line of FLASH memory cells includes forming a first line of floating gates over a crystalline silicon comprising semiconductor substrate. An alternating series of $SiO_2$ comprising isolation regions and active areas are provided in the semiconductor substrate in a second line adjacent and along at least a portion of the first line of floating gates. The series of active areas define discrete transistor source areas separated by isolation regions. A masking layer is formed over the floating gates, the regions and the areas. A third line mask opening is formed in the masking layer over at least a portion of the second line. Substantially anisotropic etching is conducted of the $SiO_2$ comprising isolation regions exposed through the third line mask opening substantially selectively relative to crystalline silicon exposed through the third line mask opening using a gas chemistry comprising a combination of at least one non-hydrogen containing fluorocarbon having at least three carbon atoms and at least one hydrogen containing fluorocarbon. The isolation regions are preferably formed in trenches previously etched into the crystalline silicon comprising semiconductor substrate. The substantially anisotropic etching preferably removes substantially all of the third line opening exposed isolation regions. Further, conductivity enhancing impurity is preferably implanted through the third line opening into the crystalline silicon comprising semiconductor substrate beneath the trenches, along sidewalls of the trenches and between the trenches and forming therefrom a continuous line of source active area within the crystalline silicon comprising semiconductor substrate along at least a portion of the first line of floating gates.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
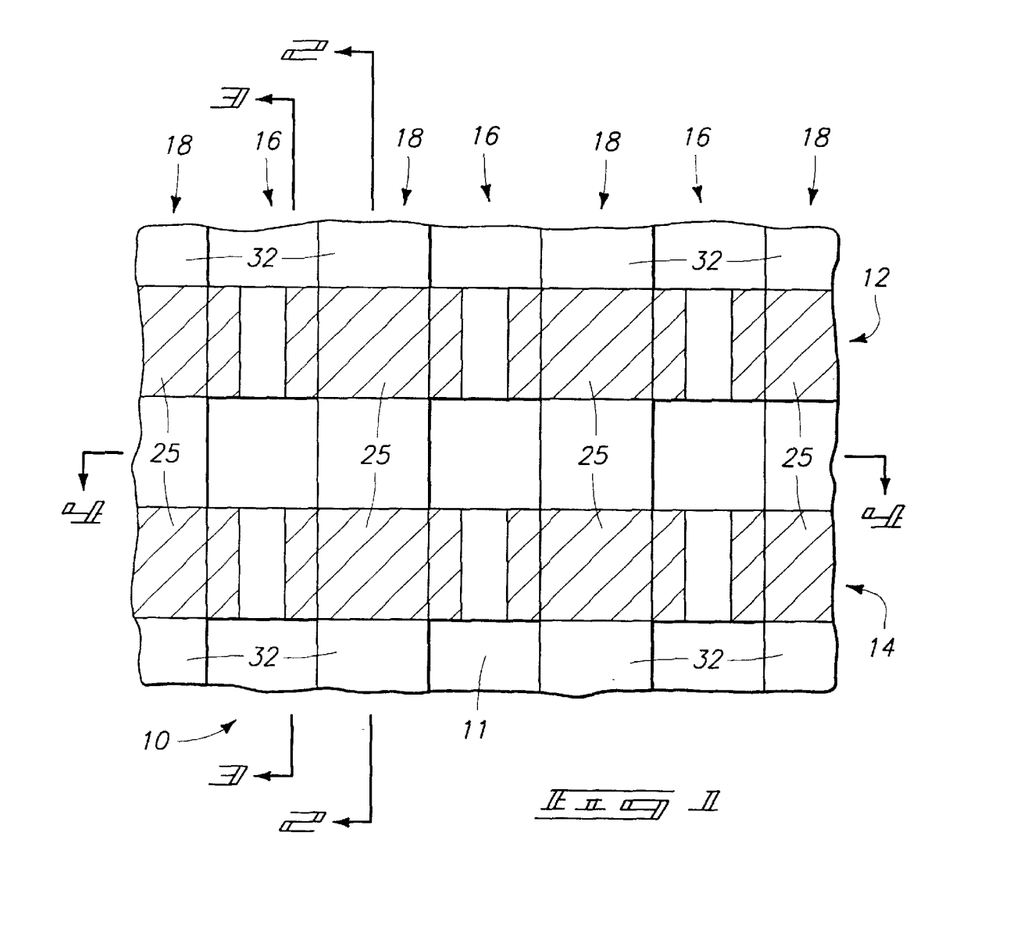
FIG. 1 is a diagrammatic top plan of a semiconductor wafer fragment in process in accordance with the invention.

Referring to FIG. 1, a portion of an array 10 of FLASH memory cells in fabrication is illustrated in top plan view. Such comprises a semiconductor substrate 11 having lines of floating gates 12 and 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Such comprises but one example of forming at least one first line of floating gates over a crystalline silicon comprising semiconductor substrate, here preferably where substrate 11 is in the form of a monocrystalline silicon substrate, although semiconductor-over-insulator and other constructions could also of course be utilized.

Figure 2:
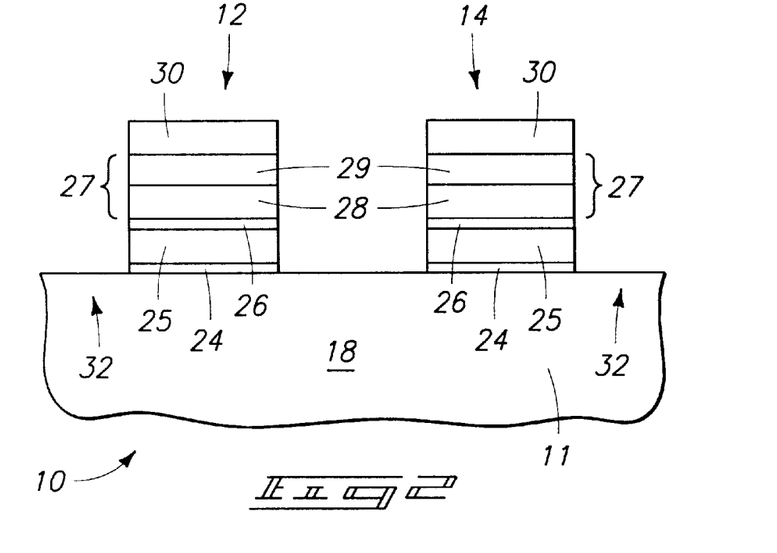
FIG. 2 is a view of a semiconductor wafer fragment in process as positionally taken through line 2—2 in FIG. 1.
Figure 3:
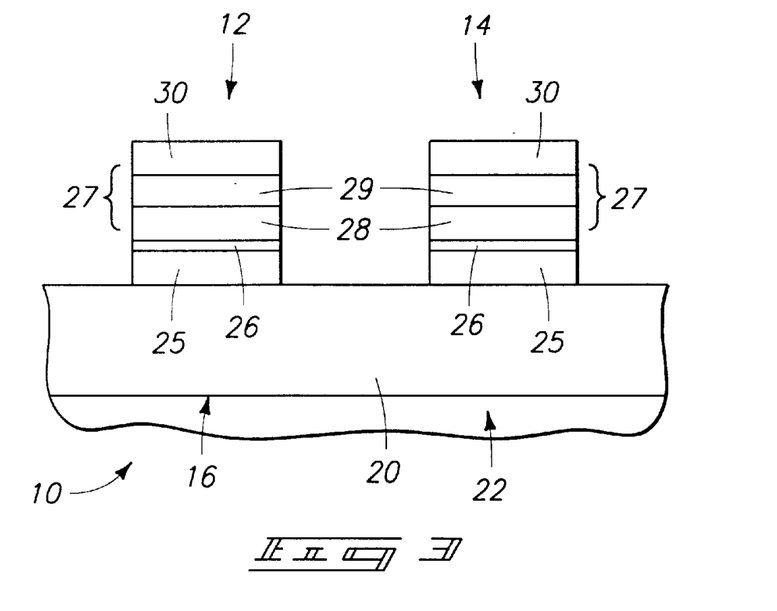
FIG. 3 is a view of a semiconductor wafer fragment in process as positionally taken through line 3—3 in FIG. 1.
Figure 4:
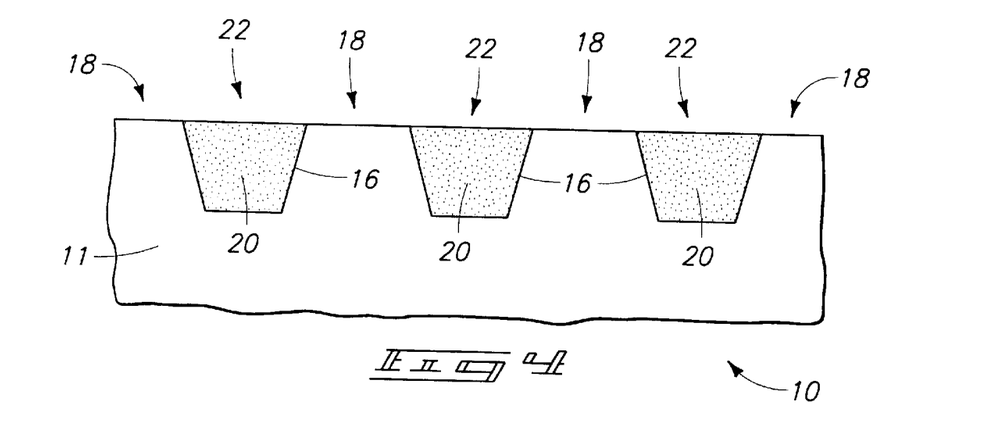
FIG. 4 is a view of a semiconductor wafer fragment in process as positionally taken through line 4—4 in FIG. 1.

Referring to FIGS. 1–4, a series of spaced trenches 16 are etched into semiconductor substrate substantially perpendicular to floating gate word lines 12 and 14. Trenches 16 are preferably formed to be at least 2000 Angstroms deep, more preferably 3000 Angstroms to 4000 Angstroms deep, and preferably have sidewalls normal or within 10°–15° of normal to the general substrate orientation. The area 18 between the trenches thereby comprises spaced lines of active area relative to substrate 11 running between spaced trenches 16. The illustrated sectional cut 4—4 in FIG. 1 is taken adjacent and parallel with lines of floating gates 12 and 14, and will constitute source active area for the respective transistors formed along lines of floating gates 12 and 14. Accordingly, FIGS. 1–4 can also be considered as depicting, in a preferred embodiment, an alternating series of trenches and active area regions provided in substrate 11 in a line (i.e., line 4—4) running adjacent and along at least a portion of lines of floating gates 12 and 14. Active area regions 18 along that line, as depicted in FIG. 4, are thereby spaced or separated by trenches 16.

FIGS. 1–4 illustrate trenches 16 having been filled with an insulating dielectric material 20, such as high density plasma deposited silicon dioxide, and subjected to a planarization step to provide a substantially planar outer surface. At this point in the preferred process, such effectively forms an alternating series of trench isolation regions 22 and active area regions 18 in semiconductor substrate 11 running in a second line adjacent and along first lines of floating gates 12 and 14. The semiconductor wafer is typically and preferably fabricated to a point as would be depicted in FIG. 4, with the lines of floating gates being fabricated thereafter. The preferred and depicted embodiment shows formation of trenches within substrate 11 by etching and subsequent fill with an insulating material, with such insulating material comprising $SiO_2$. Isolation region formation by LOCOS techniques, as well as by other techniques, are also contemplated. Regardless, the series of active areas 18 in the FIG. 4 depiction constitute or define discrete transistor source areas which are separated by isolation regions 22.

Referring to FIGS. 2 and 3, lines of floating gates 12 and 14 preferably constitute a gate dielectric layer 24 typically comprising silicon dioxide, floating gate regions 25 typically comprising conductively doped polysilicon, an interpoly dielectric layer 26 typically comprising an oxide-nitride-oxide composite, a conductive line extending portion 27 comprising a conductively doped polysilicon layer 28 and a conductive silicide layer 29, and an insulative cap 30 (i.e., typically nitride or oxide). Example preferred spacing between lines 12 and 14 in 0.2 micron.

Drain and source implants in FLASH circuitry fabrication are typically separately conducted and optimized. Either the source regions or the drain regions can be fabricated before the other, preferably the source regions being patterned first. Regardless for drain fabrication, a photoresist layer is ideally deposited and patterned to mask the floating gate word lines and source areas therebetween, and to leave the drain areas and isolation regions therebetween outwardly exposed. Exemplary drain areas 32 (FIGS. 1–3) are accordingly left outwardly exposed within active area regions 18. One or more suitable implants (not shown) are then provided to provide the desired depth and concentration of conductivity enhancing impurity to form the desired transistor drains within active areas 18 at locations 32. Alternately and by way of example only, one or more blanket implants can be conducted without using a photoresist layer to fabricate the drains.

Figure 5:
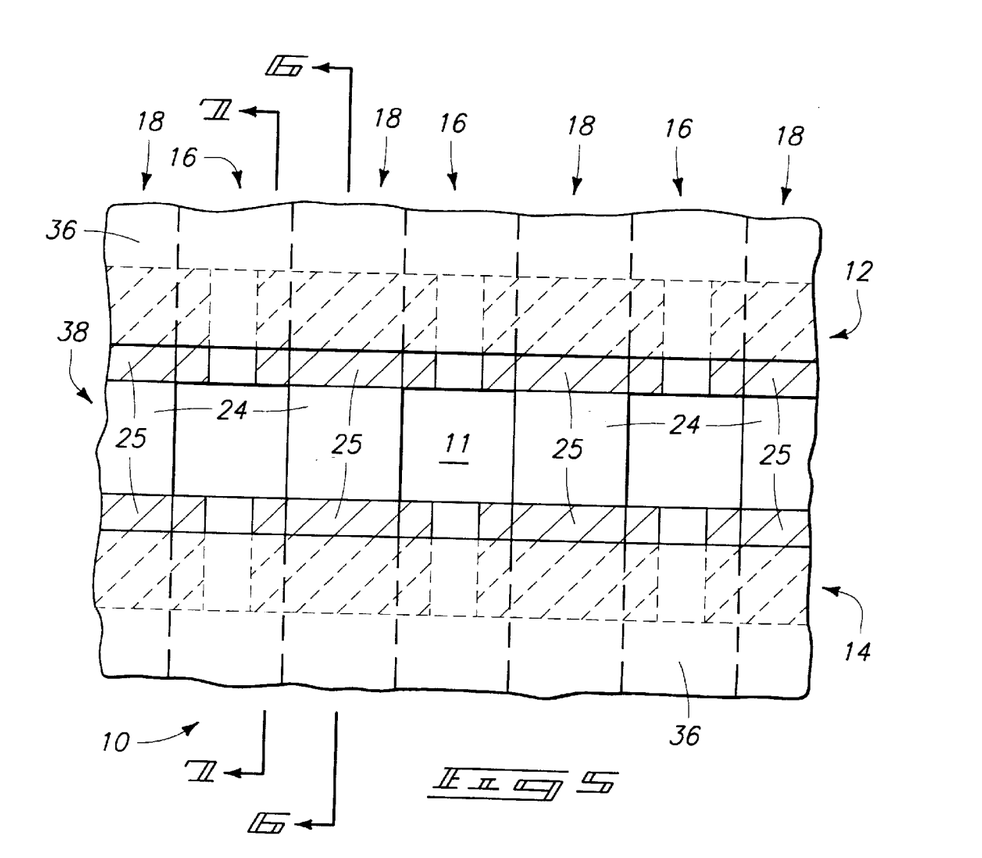
FIG. 5 is a view of the FIG. 1 wafer fragment at a processing step subsequent to that depicted by FIG. 1.
Figure 6:
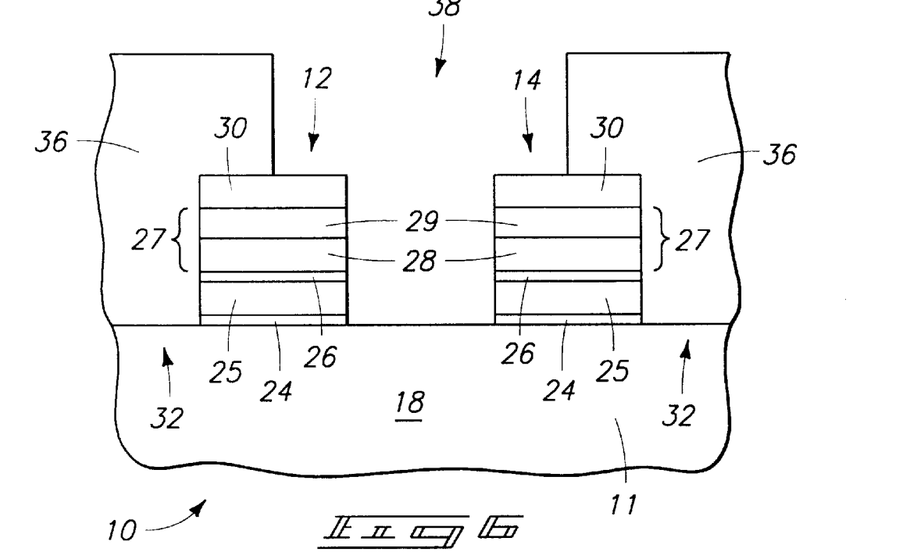
FIG. 6 is a view of the FIG. 2 wafer fragment at a processing step subsequent to that depicted by FIG. 2, and corresponding in sequence to that depicted by FIG. 5.
Figure 7:
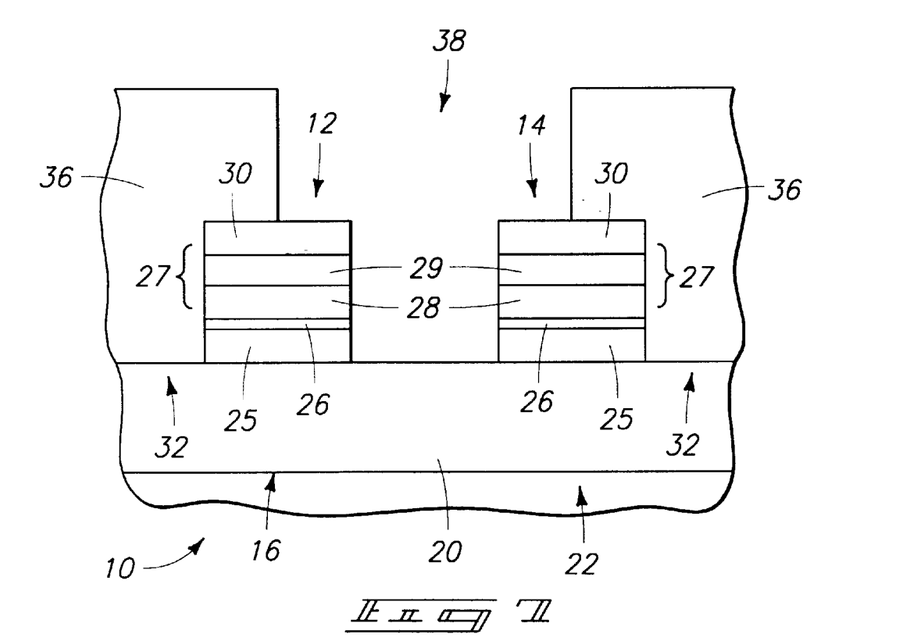
FIG. 7 is a view of the FIG. 3 wafer fragment at a processing step subsequent to that depicted by FIG. 3, and corresponding in sequence to that depicted by FIG. 5.

For source region fabrication for the respective floating gate transistors, the source line being formed in the depicted embodiment will comprise a line of source area for both lines of floating gates 12 and 14. Referring to FIGS. 5–7, a masking layer 36 is formed over floating gate lines 12 and 14, floating gates 25, regions 22 and active areas 18. Layer 36 preferably comprises photoresist, although any layer or layers capable of functioning as a mask are contemplated. An example thickness for layer 36 is from about 8,000 Angstroms to about 12,000 Angstroms. A third line mask opening 38 is formed within masking layer 36 over at least a portion of second line 4—4 (FIG. 1). Accordingly, drain areas 32 (FIG. 1) remain effectively covered by masking layer 36. Accordingly in the depicted FIG. 5 preferred embodiment, masking layer 36 is patterned to cover ideally all but the illustrated area comprising both active area and trench isolation regions running in a line between lines of floating gates 12 an 14.

Figure 8:
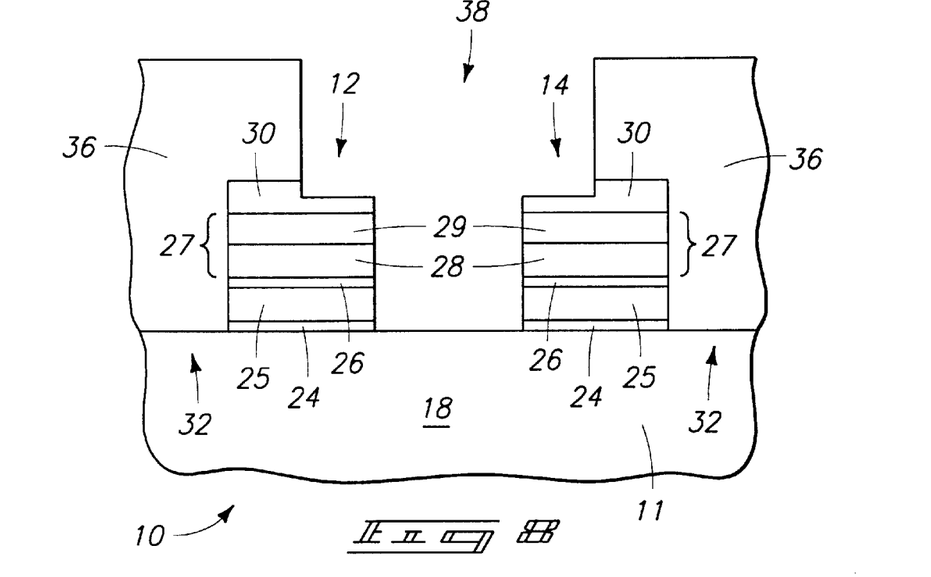
FIG. 8 is a view of the FIG. 6 wafer fragment at a processing step subsequent to that depicted by FIG. 6.
Figure 9:
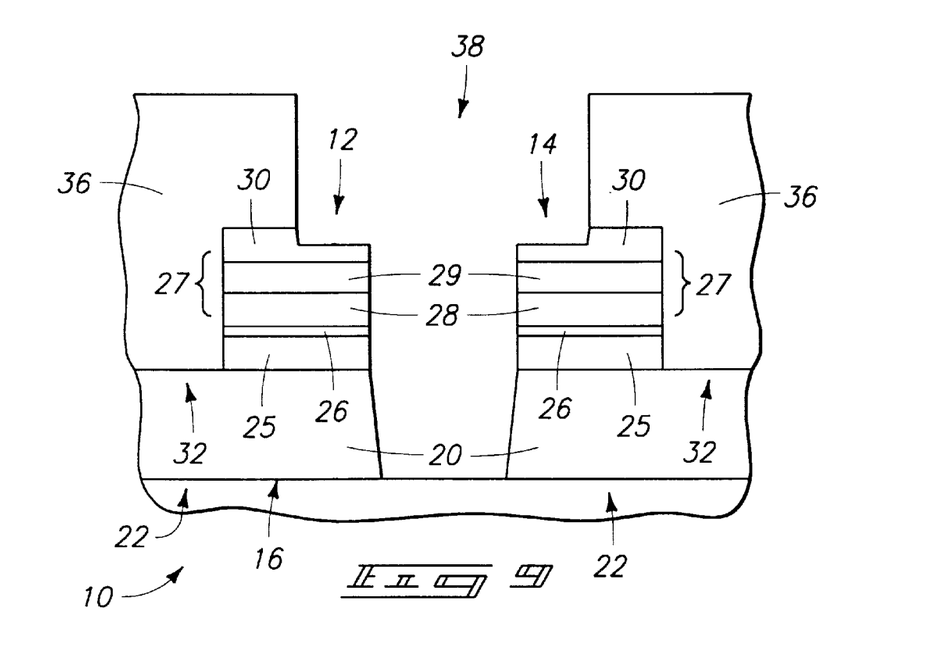
FIG. 9 is a view of the FIG. 7 wafer fragment at a processing step subsequent to that depicted by FIG. 7, and corresponding in sequence to that depicted by FIG. 8.
Figure 10:
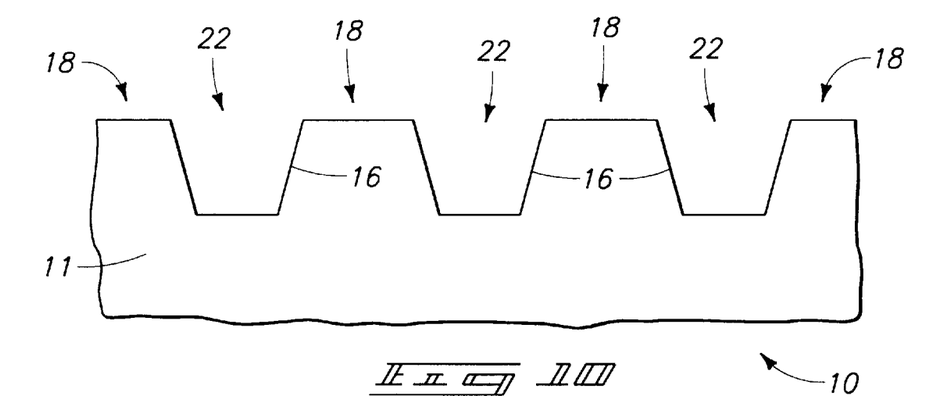
FIG. 10 is a view of the FIG. 4 wafer fragment at a processing step subsequent to that depicted by FIG. 4, and corresponding in sequence to that depicted by FIG. 8.

Referring to FIGS. 8–10, $SiO_2$ comprising isolation regions 22 ultimately exposed through third line mask opening 38 are substantially anisotropically etched substantially selectively relative to crystalline silicon exposed active area regions 18 through third line mask opening 38 using a gas chemistry comprising a combination of at least one non-hydrogen containing fluorocarbon having at least three carbon atoms and at least one hydrogen containing fluorocarbon. Preferably as shown, the substantially anisotropic etching exposes crystalline silicon material of the semiconductor substrate through opening 38. In the context of this document, "substantially selectively" means a selectivity ratio of greater than 20:1. Most preferably, the substantially anisotropic etching is conducted under conditions which achieve at least 40:1 selectivity. In certain reduction-to-practice examples, no measurable loss (i.e., any loss had to be less than 100 Angstroms) could be detected in etching a 4000 Angstroms deep isolation region filled with high density plasma deposited oxide formed by decomposition of tetraethylorthosilicate for filling trenches 16. Further in context of this document, "substantially anisotropic" means an etch which achieves within about10 degrees from normal from the wafer surface into the material in the pattern being etched.

Preferably, the substantially anisotropic etching is conducted within. a magnetically enhanced reactive ion etcher. By way of example only. examples include the TEL DRM System available from Tokyo Electron of Tokyo, Japan; the AME 5000, AME Super E, or AME IPS, available from Applied Materials of Santa Clara, Calif., or the 9100 Etcher available from LAM of Santa Clara, Calif. Further preferably and regardless, during the etching all non-hydrogen containing fluorocarbon are ideally present in the gas chemistry at a volumetric ratio of from about 5:1 to about 0.2:1 as compared to all hydrogen containing fluorocarbon in the gas chemistry, and most preferably from about 1.2:1 to about 0.8:1. Further in one preferred embodiment, the gas chemistry comprises no added hydrogen containing fluorocarbon having three or more carbon atoms, and the at least one non-hydrogen containing gas contains more than three carbon atoms. Further, the gas chemistry will typically and preferably comprise a substantially inert gas, for example a noble gas such as Ar or He, or $N_2$. Further in one preferred embodiment, the gas chemistry will consist essentially of a single non-hydrogen containing fluorocarbon having at least three carbon atoms, a single hydrogen containing fluorocarbon, and one or more inert gases. Further, the at least one non-hydrogen containing fluorocarbon might be fully saturated (i.e., no double or triple carbon bonds) or not fully saturated (i.e., one or more double or triple carbon bonds).

Example non-hydrogen containing fluorocarbons having at least three carbon atoms include, by way of example only, those selected from the group consisting of $C_4F_8$, $C_3F_6$, $C_3F_8$, and $C_5F_8$, and mixtures thereof. Example hydrogen containing fluorocarbons, by way of example only, include those selected from the group consisting of $CH_2F_2$, $CHF_3$, $CHF_3$, $CH_3F$, $C_2HF_5$, $C_2H_2F_4$ and $C_2H_3F_3$, and mixtures thereof.

One preferred specific gas chemistry included a combination of only $C_4F_8$, $CH_2F_2$ and argon. A preferred pressure during the etching is preferably from about 2 mTorr to about 100 mTorr, with about 30 mTorr being preferred. An exemplary and preferred power range is from about 500 watts to about 2500 watts, with from about 1000 watts to about 1500 watts being preferred. A preferred temperature for the chuck includes a range from about 20° C. to about 100° C., with from about 40° C. to about 50° C. being more preferred. A typical etch time to remove about 3000 Angstroms of oxide under such conditions is expected to range from 30 seconds to about 4 minutes, with about 50 seconds being typical.

First reduction-to-practice examples in accordance with an aspect of the invention conducted in a TEL DRM etcher are shown below. Chuck temperature for each wafer was 50° C. Time of etch was 50 seconds for a 4000 Angstrom thick trench isolation region.

TABLE I

First Test

| Wafer | Power (Watts) | Pressure (mTorr) | $C_4F_8$ Flow (sccm) | $CH_2F_2$ Flow (sccm) | Ar Flow (sccm) |
| --- | --- | --- | --- | --- | --- |
| 1 | 1500 | 45 | 9 | 4 | 500 |
| 2 | 1500 | 45 | 12 | 4 | 500 |
| 3 | 1500 | 45 | 9 | 6 | 500 |
| 4 | 1500 | 45 | 12 | 6 | 500 |

Average selectivity achieved was about 400 Angstroms of silicon loss in clearing 4000 Angstroms of oxide material from the exposed portion of the isolation regions.

A second batch of wafers was conducted as shown below wherein greater selectivity (i.e., average selectivity of from about 100 Angstroms to about 400 Angstroms of silicon loss in clearing 4000 Angstroms of oxide material from the exposed portion of the isolation regions) was achieved.

TABLE II

Second Test

| Wafer | Power (Watts) | Pressure (mTorr) | $C_4F_8$ Flow (sccm) | $CH_2F_2$ Flow (sccm) | Ar Flow (sccm) |
|---|---|---|---|---|---|
| 5 | 1500 | 45 | 9 | 8 | 500 |
| 6 | 1500 | 45 | 9 | 8 | 450 |
| 7 | 1500 | 35 | 7 | 3 | 450 |
| 8 | 1500 | 35 | 7 | 6 | 450 |
| 9 | 1250 | 35 | 7 | 3 | 450 |

Such evidenced improved selectivity for increasing $CH_2H_2$ flow.

A third batch was run under the following conditions:

TABLE III

Third Test

| Wafer | Power (Watts) | Pressure (mTorr) | $C_4F_8$ Flow (sccm) | $CH_2F_2$ Flow (sccm) | Ar Flow (sccm) |
|---|---|---|---|---|---|
| 10 | 1500 | 45 | 9 | 8 | 500 |
| 11 | 1500 | 35 | 9 | 8 | 450 |
| 14 | 1500 | 55 | 7 | 3 | 450 |
| 13 | 1500 | 45 | 9 | 10 | 450 |

Average selectivity achieved was less than about 200 Angstroms of silicon loss in clearing 4000 Angstroms of oxide material from the exposed portion of the isolation regions, with wafer #13 being the best in showing no measurable silicon loss. Center-to-edge etch uniformity was not quite as high as desired.

A subsequent batch of wafers was conducted as indicated below

TABLE IV

Fourth Test

| Wafer | Power (Watts) | Pressure (mTorr) | $C_4F_8$ Flow (sccm) | $CH_2F_2$ Flow (sccm) | Ar Flow (sccm) |
|---|---|---|---|---|---|
| A | 1500 | 45 | 9 | 10 | 450 |
| B | 1500 | 35 | 9 | 10 | 450 |
| C | 1500 | 55 | 9 | 10 | 450 |

Average selectivity achieved was about the same as the tests run in Table III. No improvement was shown in this particular system by varying pressure.

Further, the results tended to show that as silicon loss in the active areas 18 not beneath trenches 16 was reduced, the taper or slope of the openings etched in the oxidation regions tended away from vertical in increasing degree. Such would reduce source width of line 50 at the bottom of the trench, and have the probable negative effect of increasing source line resistance which can reduce programming speed and cell current.

In the above depicted construction in a TEL etcher using the subject chemistry, a more specific preferred example embodiment comprises a two-step process for the etch. In a first stabilization step conducted for about 3 minutes, gap between wafer and top electrode was 27 mm, pressure was 45 Mtorr, lower RF power at 0 W, $C_4F_8$ flow at 9 sccm, $C_2H_2F_2$ at 10 sccm, Ar flow at 450 sccm, edge back pressure at 40 Torr, center back pressure at 7 Torr, upper lid temperature at 60° C., lower chuck temperature at 60° C., and wall temperature at 50° C. In a second step conducted for about 50 seconds, gap between wafer and top electrode was 27 mm, pressure is 45 mTorr, lower RF power at 1500 W, $C_4F_8$ flow at 8 sccm, $C_2H_2F_2$ at 10 sccm, Ar flow at 450 sccm, edge back pressure at 40 Torr, center back pressure at 7 Torr, upper lid temperature at 60° C., lower chuck temperature at 60° C., and wall temperature is at 50° C. No measurable silicon loss could be found when operating under these parameters.

However, the invention is not so limited to the subject etcher, chemistry, conditions, or substrate, with preferred ranges for the same being readily determinable by persons of skill in the art in the context of the invention using a gas chemistry comprising a combination of at least one non-hydrogen containing fluorocarbon having at least three carbon atoms and at least one hydrogen containing fluorocarbon.

Figure 11:
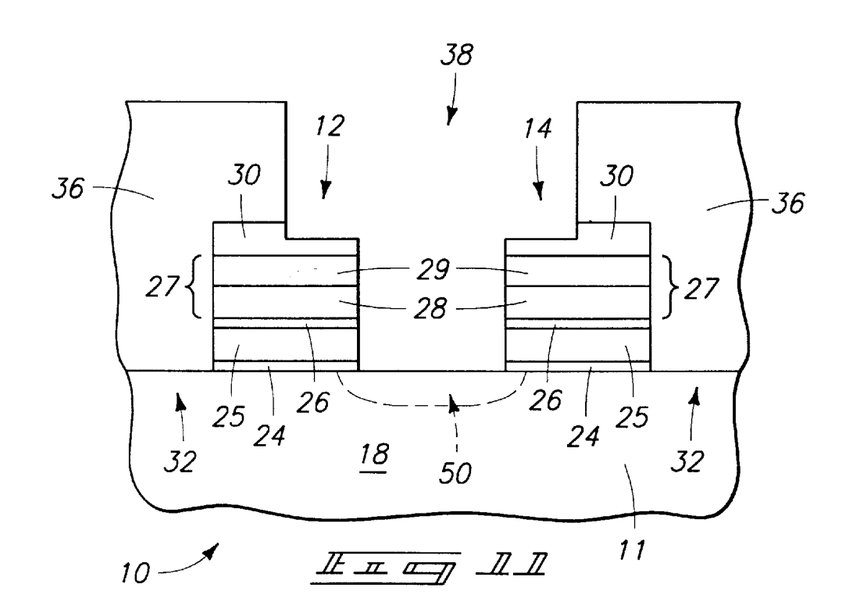
FIG. 11 is a view of the FIG. 8 wafer fragment at a processing step subsequent to that depicted by FIG. 8.
Figure 12:
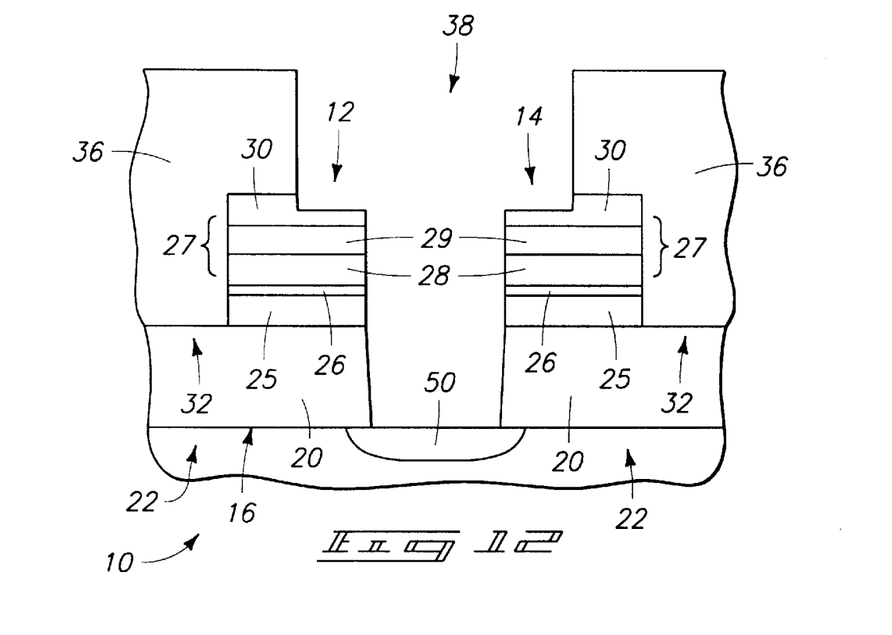
FIG. 12 is a view of the FIG. 9 wafer fragment at a processing step subsequent to that depicted by FIG. 9, and corresponding in sequence to that depicted by FIG. 11.
Figure 13:
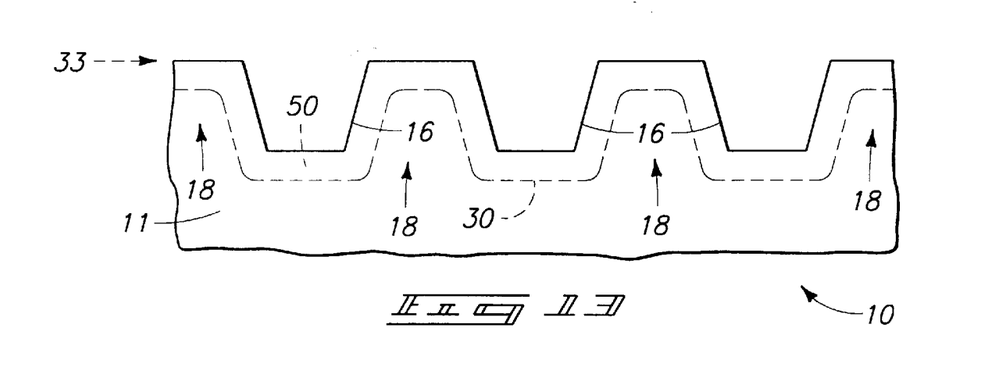
FIG. 13 is a view of the FIG. 10 wafer fragment at a processing step subsequent to that depicted by FIG. 10, and corresponding in sequence to that depicted by FIG. 11.

Referring to FIGS. 11–13, preferred aspects of the invention further comprise implanting conductivity enhancing impurity through third line opening 38 into the crystalline silicon comprising semiconductor substrate beneath the trenches, along sidewalls of the trenches, and between the trenches, and forming therefrom a continuous line 50 of source active area within the crystalline silicon comprising semiconductor substrate along at least a portion of floating gate lines 12 and 14. Any existing or yet-to-be developed implementations for the implantings are, of course, possible. Example preferred implantings are disclosed in our U.S. patent application Ser. No. 09/260,182, filed Mar. 1, 1999, entitled "Flash Memory and Method of Forming Flash Memory", naming Graham Wolstenholme as inventor; and U.S. patent application Ser. No. 09/225,893, filed Jan. 4, 1999, entitled "Method Of Forming Flash Memory, Method Of Forming Flash Memory And SRAM Circuitry, And Etching Methods", naming Kirk D. Prall, Gregg R. Rettschlag, and Graham Wolstenholme as inventors, both of which are hereby incorporated by reference as if included fully herein.

Further preferably and immediately prior to the implanting, where the masking layer comprises photoresist, some of the photoresist is etched away in an oxygen containing ambient. An intent is to remove any polymer which might have and typically forms along sidewalls of the masking layer and material 20, and over the bases of the opening being etched prior to implanting. Such should facilitate uniformity in the implant across the substrate and from wafer to wafer. An example preferred oxygen containing implant comprises one or more of $O_2$ or $O_3$. A specific example in the TEL DRM System includes $O_2$ at 15 sccm, 400 Watts, 30 mTorr, 40° C., for 40 seconds. Such has resulted in removal of about 1000 Angstroms of resist.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a line of FLASH memory cells comprising:
  forming a first line of floating gates over a crystalline silicon comprising semiconductor substrate;
  providing an alternating series of $SiO_2$ comprising isolation regions and active areas in the semiconductor substrate in a second line adjacent and along at least a portion of the first line of floating gates, the series of active areas defining discrete transistor source areas separated by isolation regions;
  forming a masking layer over the floating gates, the regions and the areas;
  forming a third line mask opening in the masking layer over at least a portion of the second line; and
  substantially anisotropically etching the $SiO_2$ comprising isolation regions exposed through the third line mask opening substantially selectively relative to crystalline silicon exposed through the third line mask opening using a gas chemistry comprising a combination of at least one non-hydrogen containing fluorocarbon having at least three carbon atoms and at least one hydrogen containing fluorocarbon.

2. The method of claim 1 wherein the isolation regions are formed in trenches previously etched into the crystalline silicon comprising semiconductor substrate and the substantially anisotropic etching exposes crystalline silicon material of the semiconductor substrate; and
  further comprising implanting conductivity enhancing impurity through the third line opening into the crystalline silicon comprising semiconductor substrate beneath the trenches, along sidewalls of the trenches and between the trenches and forming therefrom a continuous line of source active area within the crystalline silicon comprising semiconductor substrate along at least a portion of the first line of floating gates.

3. The method of claim 2 wherein the masking layer comprises photoresist and further comprising after the substantially anisotropic etching, etching only some of the photoresist in an oxygen containing ambient prior to the implanting.

4. The method of claim 1 wherein the substantially anisotropic etching is conducted under conditions which achieve at least 40:1 selectivity.

5. The method of claim 1 wherein the substantially anisotropic etching is conducted within a magnetically enhanced reactive ion etcher.

6. The method of claim 1 wherein all non-hydrogen containing fluorocarbon are present in the gas chemistry at a volumetric ratio of from about 5:1 to about 0.2:1 as compared to all hydrogen containing fluorocarbon.

7. The method of claim 1 wherein all non-hydrogen containing fluorocarbon are present in the gas chemistry at a volumetric ratio of from about 1.2:1 to about 0.8:1 as compared to all hydrogen containing fluorocarbon.

8. The method of claim 1 wherein the gas chemistry comprises no added hydrogen containing fluorocarbon having three or more carbon atoms.

9. The method of claim 1 wherein the at least one non-hydrogen containing gas contains more than 3 carbon atoms.

10. The method of claim 1 wherein the gas chemistry comprises a substantially inert gas.

11. The method of claim 1 wherein the gas chemistry consists essentially of only one non-hydrogen containing fluorocarbon having at least three carbon atoms, only one hydrogen containing fluorocarbon, and one or more inert gases.

12. The method of claim 1 wherein the at least one non-hydrogen containing fluorocarbon is fully saturated.

13. The method of claim 1 wherein the at least one non-hydrogen containing fluorocarbon is not fully saturated.

14. The method of claim 1 wherein the at least one non-hydrogen containing fluorocarbon comprises $C_4F_8$.

15. The method of claim 1 wherein the at least one non-hydrogen containing fluorocarbon comprises $C_3F_6$.

16. The method of claim 1 wherein the at least one non-hydrogen containing fluorocarbon comprises $C_3F_8$.

17. The method of claim 1 wherein the at least one non-hydrogen containing fluorocarbon comprises $C_5F_8$.

18. The method of claim 1 wherein the at least one hydrogen containing fluorocarbon comprises $CHF_3$.

19. The method of claim 1 wherein the at least one hydrogen containing fluorocarbon comprises $CH_3F$.

20. The method of claim 1 wherein the at least one hydrogen containing fluorocarbon comprises $CH_2F_2$.

21. The method of claim 1 wherein the at least one hydrogen containing fluorocarbon comprises $C_2HF_5$.

22. The method of claim 1 wherein the at least one hydrogen containing fluorocarbon comprises $C_2H_2F_4$.

23. The method of claim 1 wherein the at least one hydrogen containing fluorocarbon comprises $C_2H_3F_3$.

24. The method of claim 1 wherein the crystalline silicon comprising substrate comprises monocrystalline silicon.

25. The method of claim 1 wherein the masking layer comprises photoresist.

26. A method of forming a line of FLASH memory cells comprising:
  forming a first line of floating gates over a crystalline silicon comprising semiconductor substrate;
  providing an alternating series of $SiO_2$ comprising trench isolation regions formed within trenches in the semiconductor substrate and active areas in the semiconductor substrate in a second line adjacent and along at least a portion of the first line of floating gates, the series of active areas defining discrete transistor source areas separated by trench isolation regions;
  forming a masking layer over the floating gates, the regions and the areas;
  forming a third line mask opening in the masking layer over at least a portion of the second line;
  substantially anisotropically etching the $SiO_2$ comprising trench isolation regions exposed through the third line mask opening substantially selectively relative to crystalline silicon exposed through the third line mask opening using a gas chemistry comprising a combination of a) a non-hydrogen containing fluorocarbon having at least three carbon atoms selected from the group consisting of $C_4F_8$, $C_3F_6$, $C_3F_8$, and $C_5F_8$, and mixtures thereof, and b) at least one hydrogen containing fluorocarbon selected from the group consisting of $CH_2F_2$, $CHF_3$, $CHF_3$, $CH_3F$, $C_2HF_5$, $C_2H_2F_4$ and $C_2H_3F_3$ and mixtures thereof; and
  implanting conductivity enhancing impurity through the third line opening into the crystalline silicon comprising semiconductor substrate beneath the trenches, along sidewalls of the trenches and between the trenches and forming therefrom a continuous line of source active area within the crystalline silicon comprising semiconductor substrate along at least a portion of the first line of floating gates.

27. The method of claim 26 wherein the masking layer comprises photoresist and further comprising after the substantially anisotropic etching, etching only some of the photoresist in an oxygen containing ambient prior to the implanting.

28. The method of claim 26 wherein the non-hydrogen containing fluorocarbon comprises $C_4F_8$.

29. The method of claim 26 wherein the non-hydrogen containing fluorocarbon comprises $C_3F_6$.

30. The method of claim 26 wherein the non-hydrogen containing fluorocarbon comprises $C_3F_8$.

31. The method of claim 26 wherein the non-hydrogen containing fluorocarbon comprises $C_5F_8$.

32. The method of claim 26 wherein the hydrogen containing fluorocarbon comprises $CHF_3$.

33. The method of claim 26 wherein the hydrogen containing fluorocarbon comprises $CH_3F$.

34. The method of claim 26 wherein the hydrogen containing fluorocarbon comprises $CH_2F_2$.

35. The method of claim 26 wherein the hydrogen containing fluorocarbon comprises $C_2HF_5$.

36. The method of claim 26 wherein the hydrogen containing fluorocarbon comprises $C_2H_2F_4$.

37. The method of claim 26 wherein the hydrogen containing fluorocarbon comprises $C_2H_3F_3$.

38. The method of claim 26 wherein the substantially anisotropic etching is conducted within a magnetically enhanced reactive ion etcher.

39. The method of claim 26 wherein all non-hydrogen containing fluorocarbon are present in the gas chemistry at a volumetric ratio of from about 5:1 to about 0.2:1 as compared to all hydrogen containing fluorocarbon.

40. The method of claim 26 wherein all non-hydrogen containing fluorocarbon are present in the gas chemistry at a volumetric ratio of from about 1.2:1 to about 0.8:1 as compared to all hydrogen containing fluorocarbon.

41. A method of forming a line of FLASH memory cells comprising:

forming a first line of floating gates over a crystalline silicon comprising semiconductor substrate;

providing an alternating series of $SiO_2$ comprising isolation regions in the semiconductor substrate and active areas in the semiconductor substrate in a second line adjacent and along at least a portion of the first line of floating gates, the series of active areas defining discrete transistor source areas separated by isolation regions;

forming a masking layer over the floating gates, the regions and the areas;

forming a third line mask opening in the masking layer over at least a portion of the second line;

substantially anisotropically etching the $SiO_2$ comprising isolation regions exposed through the third line mask opening substantially selectively relative to crystalline silicon exposed through the third line mask opening using a gas chemistry comprising a combination of a) a non-hydrogen containing fluorocarbon having at least three carbon atoms selected from the group consisting of $C_4F_8$, $C_3F_6$, $C_3F_8$, and $C_5F_8$, and mixtures thereof, and b) at least one hydrogen containing fluorocarbon selected from the group consisting of $CH_2F_2$, $CHF_3$, $CHF_3$, $CH_3F$, $C_2HF_5$, $C_2H_2F_4$ and $C_2H_3F_3$, and mixtures thereof; and implanting conductivity enhancing impurity through the third line opening into the crystalline silicon comprising semiconductor substrate and forming therefrom a continuous line of source active area within the crystalline silicon comprising semiconductor substrate along at least a portion of the first line of floating gates.

42. The method of claim 41 wherein the masking layer comprises photoresist and further comprising after the substantially anisotropic etching, etching only some of the photoresist in an oxygen containing ambient prior to the implanting.

43. A method of forming a line of FLASH memory cells comprising:

forming a first line of floating gates over a crystalline silicon comprising semiconductor substrate;

providing an alternating series of $SiO_2$ comprising isolation regions and active areas in the semiconductor substrate in a second line adjacent and along at least a portion of the first line of floating gates, the series of active areas defining discrete transistor source areas separated by isolation regions;

forming a masking layer over the floating gates, the regions and the areas;

forming a third line mask opening in the masking layer over at least a portion of the second line; and substantially anisotropically etching the $SiO_2$ comprising isolation regions exposed through the third line mask opening substantially selectively relative to crystalline silicon exposed through the third line mask opening using a gas chemistry comprising a combination of at least one non-hydrogen containing fluorocarbon and at least one hydrogen containing fluorocarbon.

44. The method of claim 43 wherein the gas chemistry consists essentially of only one non-hydrogen containing fluorocarbon, only one hydrogen containing fluorocarbon, and one or more inert gases.

45. The method of claim 43 wherein the at least one non-hydrogen containing fluorocarbon is not fully saturated.

46. The method of claim 43 wherein the at least one non-hydrogen containing fluorocarbon is fully saturated.

47. The method of claim 43 wherein the at least one hydrogen containing fluorocarbon comprises $CHF_3$.

48. The method of claim 43 wherein the at least one hydrogen containing fluorocarbon comprises $CH_3F$.

49. The method of claim 43 wherein the at least one hydrogen containing fluorocarbon comprises $CH_2F_2$.

50. The method of claim 43 wherein the at least one hydrogen containing fluorocarbon comprises $C_2HF_5$.

51. The method of claim 43 wherein the at least one hydrogen containing fluorocarbon comprises $C_2H_2F_4$.

52. The method of claim 43 wherein the at least one hydrogen containing fluorocarbon comprises $C_2H_3F_3$.

53. A method of forming a line of FLASH memory cells comprising:

forming a first line of floating gates over a semiconductor substrate;

providing an alternating series of $SiO_2$ comprising isolation regions and active areas in the semiconductor substrate in a second line adjacent and along at least a portion of the first line of floating gates, the series of active areas defining discrete transistor source areas separated by isolation regions;

forming a masking layer over the floating gates, the regions and the areas;

forming a third line mask opening in the masking layer over at least a portion of the second line; and substantially anisotropically etching the $SiO_2$ comprising isolation regions exposed through the third line mask opening using a gas chemistry comprising a combination of at least one non-hydrogen containing fluorocarbon and at least one hydrogen containing fluorocarbon.

54. The method of claim 53 wherein the gas chemistry consists essentially of only one non-hydrogen containing fluorocarbon, only one hydrogen containing fluorocarbon, and one or more inert gases.

55. The method of claim 53 wherein the at least one non-hydrogen containing fluorocarbon is not fully saturated.

56. The method of claim 53 wherein the at least one non-hydrogen containing fluorocarbon is fully saturated.

57. The method of claim 53 wherein the at least one hydrogen containing fluorocarbon comprises $CHF_3$.

58. The method of claim 53 wherein the at least one hydrogen containing fluorocarbon comprises $CH_3F$.

59. The method of claim 53 wherein the at least one hydrogen containing fluorocarbon comprises $CH_2F_2$.

60. The method of claim 53 wherein the at least one hydrogen containing fluorocarbon comprises $C_2HF_5$.

61. The method of claim 53 wherein the at least one hydrogen containing fluorocarbon comprises $C_2H_2F_4$.

62. The method of claim 53 wherein the at least one hydrogen containing fluorocarbon comprises $C_2H_3F_3$.

63. A method of forming a line of FLASH memory cells comprising:

forming a line of floating gates over a semiconductor substrate providing an alternating series of $SiO_2$ comprising isolation regions and active areas in the semiconductor substrate; and substantially anisotropically etching the $SiO_2$ comprising isolation regions in a line adjacent the line of floating gates using a gas chemistry comprising a combination of at least one non-hydrogen containing fluorocarbon and at least one hydrogen containing fluorocarbon.

64. The method of claim 63 wherein the gas chemistry consists essentially of only one non-hydrogen containing fluorocarbon, only one hydrogen containing fluorocarbon, and one or more inert gases.

65. The method of claim 63 wherein the at least one non-hydrogen containing fluorocarbon is not fully saturated.

66. The method of claim 63 wherein the at least one non-hydrogen containing fluorocarbon is fully saturated.

67. The method of claim 63 wherein the at least one hydrogen containing fluorocarbon comprises $CHF_3$.

68. The method of claim 63 wherein the at least one hydrogen containing fluorocarbon comprises $CH_3F$.

69. The method of claim 63 wherein the at least one hydrogen containing fluorocarbon comprises $CH_2F_2$.

70. The method of claim 63 wherein the at least one hydrogen containing fluorocarbon comprises $C_2HF_5$.

71. The method of claim 63 wherein the at least one hydrogen containing fluorocarbon comprises $C_2H_2F_4$.

72. The method of claim 63 wherein the at least one hydrogen containing fluorocarbon comprises $C_2H_3F_3$.

* * * * *